United States Patent
Bae et al.

(10) Patent No.: US 7,436,116 B2
(45) Date of Patent: Oct. 14, 2008

(54) ORGANIC ELECTROLUMINESCENCE DISPLAY WITH TILTED UPPER SUBSTRATE

(75) Inventors: Hyo dae Bae, Daegu (KR); Byoung Nam Kim, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/152,348

(22) Filed: Jun. 15, 2005

(65) Prior Publication Data
US 2005/0280365 A1 Dec. 22, 2005

(30) Foreign Application Priority Data
Jun. 16, 2004 (KR) ....................... 10-2004-0044330

(51) Int. Cl.
*H01J 63/04* (2006.01)
(52) U.S. Cl. .................. 313/512; 313/498; 313/504; 313/506
(58) Field of Classification Search ................. 313/512, 313/498, 504–506; 445/24–25; 315/169.1
See application file for complete search history.

(56) References Cited

U.S. PATENT DOCUMENTS

| | | | | |
|---|---|---|---|---|
| 6,111,357 A | * | 8/2000 | Fleming et al. ............. | 313/509 |
| 6,624,570 B1 | * | 9/2003 | Nishio et al. ................. | 313/506 |
| 6,633,121 B2 | * | 10/2003 | Eida et al. .................... | 313/504 |
| 6,762,552 B1 | * | 7/2004 | Duineveld et al. .......... | 313/506 |
| 2001/0013756 A1 | * | 8/2001 | Mori et al. ................... | 313/512 |
| 2002/0057565 A1 | * | 5/2002 | Seo ............................. | 362/84 |
| 2002/0187575 A1 | * | 12/2002 | Maruyama et al. ............ | 438/33 |
| 2003/0077971 A1 | * | 4/2003 | Lai et al. ....................... | 445/24 |

FOREIGN PATENT DOCUMENTS

JP    2002-093578 A    3/2002

* cited by examiner

*Primary Examiner*—Toan Ton
*Assistant Examiner*—Hana A Sanei
(74) *Attorney, Agent, or Firm*—Birch, Stewart, Kolasch & Birch, LLP

(57) ABSTRACT

There is disclosed an organic electro luminescence display device that is adaptive for improving rigidity.

A cap of an organic electro luminescence display device according to an embodiment of the present invention includes a first plane part which is opposite to the organic electro luminescence array; a second plane part which is bonded with the substrate through a sealant; and a tilt part which connects the first plane part and the second plane part and forms a designated angle with the second plane part.

1 Claim, 5 Drawing Sheets

ORGANIC ELECTROLUMINESCENCE DISPLAY WITH TILTED UPPER SUBSTRATE

This application claims the benefit of the Korean Patent Application No. P2004-44330 filed on Jun. 16, 2004, which is hereby incorporated by reference.

BACKGROUND OF THE INVENTION

1. Field of the Invention

The present invention relates to an organic electro luminescence display device, and more particularly to an organic electro luminescence display device that is adaptive for improving rigidity.

2. Description of the Related Art

Recently, there have been developed a variety of flat panel display devices that can reduce their weight and size, which are a disadvantage of a cathode ray tube CRT. The flat panel display device includes a liquid crystal display LCD, a field emission display FED, a plasma display panel PDP and an electro luminescence EL display device. Particularly, the EL display device has electrodes stuck to both of the sides of an organic light emitting layer basically composed of a hole transport layer, a light emitting layer and an electron transport layer, and becomes the center of attention as a next generation flat panel display device because of its characteristics such as wide viewing angle, high aperture ratio and high chromaticity.

The EL display device is largely divided into an inorganic EL display device and an organic EL display device in accordance with a material used. In the organic EL display device, electrons and holes form a pair and then become extinct to emit light if electric charges are injected into an organic EL layer which is formed between a hole injection electrode and an electron injection electrode, thus there is an advantage in that it can be driven at a lower voltage than the inorganic EL display device. Further, the organic EL display device can be driven at a low voltage of not greater than 10V in comparison with the PDP or the inorganic ELD as well as forming the device on a flexible transparent substrate like plastics, and its power consumption is relative low and its color impression is excellent.

FIG. 1 is a sectional diagram briefly representing a related art organic EL display device, and FIG. 2 is a diagram for explaining a light emitting principle of the organic EL display device shown in FIG. 1.

The organic EL display device shown in FIG. 1 includes an organic EL array 15 having a first electrode (or an anode electrode) 4 and a second electrode (or a cathode electrode) 12 formed on a substrate 2 to cross each other with an organic light emitting layer 10 therebetween; and a cap 28 for packing the organic EL array 15.

A plurality of anode electrodes 4 of the organic EL array 15 is formed on the substrate 2 to be separate from one another with a designated distance therebetween. An insulating film 6 having a hollow part for each EL cell (EL) area is formed on the substrate 2 where the anode electrode 4 is formed. A barrier rib 8 is located on the insulating film 6, wherein the barrier rib separates an organic light emitting layer 10 and the cathode electrode 12 which are to be formed on the insulating film 6. The barrier rib 8 is formed in a direction of traversing the anode electrode 4 and has a reverse taper structure that an upper part has a wider width than a lower part. The organic light emitting layer 10 and the cathode electrode 12 composed of an organic compound are sequentially deposited on the whole surface of the insulating film where the barrier rib 8 is formed. The organic light emitting layer 10 includes an electron injection layer, an electron transport layer, a light emitting layer, a hole transport layer, and a hole injection layer.

The organic EL array 15 has characteristics of being easily deteriorated by moisture and oxygen. In order to solve this problem, there is performed an encapsulation process that the cap 28 and the substrate 2 where the organic EL array 15 is formed are bonded through a sealant 25 such as epoxy resin, thus the organic EL array 15 is protected from the moisture and oxygen.

The cap 28 includes a getter 22 which is located on a surface opposite to the organic EL array 15 and absorbs moisture and oxygen. Herein, the getter 22 is of an inorganic oxide, i.e., calcium oxide CaO and barium oxide BaO which form an oxalic radical (OH) by reacting on moisture.

In the organic EL display device, as shown in FIG. 2, if a voltage is applied between the anode electrode 4 and the cathode electrode 12, the electron generated at the cathode electrode 12 moves to the light emitting layer 10C through an electron injection layer 10a and an electron transport layer 10b. Further, the hole generated at the anode electrode 4 moves to the light emitting layer 10c through a hole injection layer 10e and a hole transport layer 10d. Accordingly, in the light emitting layer 10c, the electron and the hole supplied from the electron transport layer 10b and the hole transport layer 10d are recombined to form an exiton, and the exiton is excited again to a ground state, thus a light of a fixed energy is emitted to the outside through the anode electrode 4, thereby displaying a picture.

On the other hand, the related art cap 28 is formed in a three step structure where it includes a first plane 28a where the getter 22 is formed, a third plane 28c over which the sealant 25 is spread, and a second plane 28b between the first plane 28a and the third plane 28c, thus there is a problem in that the size of the overall organic EL display device is big. In order to solve the problem, there is proposed a cap 29 of a two step structure shown in FIG. 3.

The cap 29 shown in FIG. 3 includes a first plane 29a where the getter 22 is located, a second plane 29b over which the sealant 25 is spread, and a vertical plane 29c between the first plane 29a and the second plane 29b, thus the device can be made thinner than the cap 28 of the three step structure shown in FIG. 1.

However, the structure shown in FIG. 3 has an advantage of being made thinner, but there is a problem in that it can be twisted by a small mechanical impact, shock and soon because rigidity is deteriorated.

SUMMARY OF THE INVENTION

Accordingly, it is an object of the present invention to provide an organic electro luminescence display device that is adaptive for improving rigidity.

In order to achieve these and other objects of the invention, an organic electro luminescence display device has a cap which packs an organic electro luminescence array according to an aspect of the present invention, wherein the cap includes a first plane part which is opposite to the organic electro luminescence array; a second plane part which is bonded with the substrate through a sealant; and a tilt part which connects the first plane part and the second plane part and forms a designated angle with the second plane part.

In the organic electro luminescence display device, an angle formed between the second plane part and the tilt part is about 20°~85°.

In the organic electro luminescence display device, an angle formed between the second plane part and the tilt part is about 40°~70°.

In the organic electro luminescence display device, the organic electro luminescence array includes first and second electrodes formed to cross each other with an organic light emitting layer therebetween; and a barrier rib formed in parallel to any one of the first and second electrodes.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 4 and 5.

Figure 1:
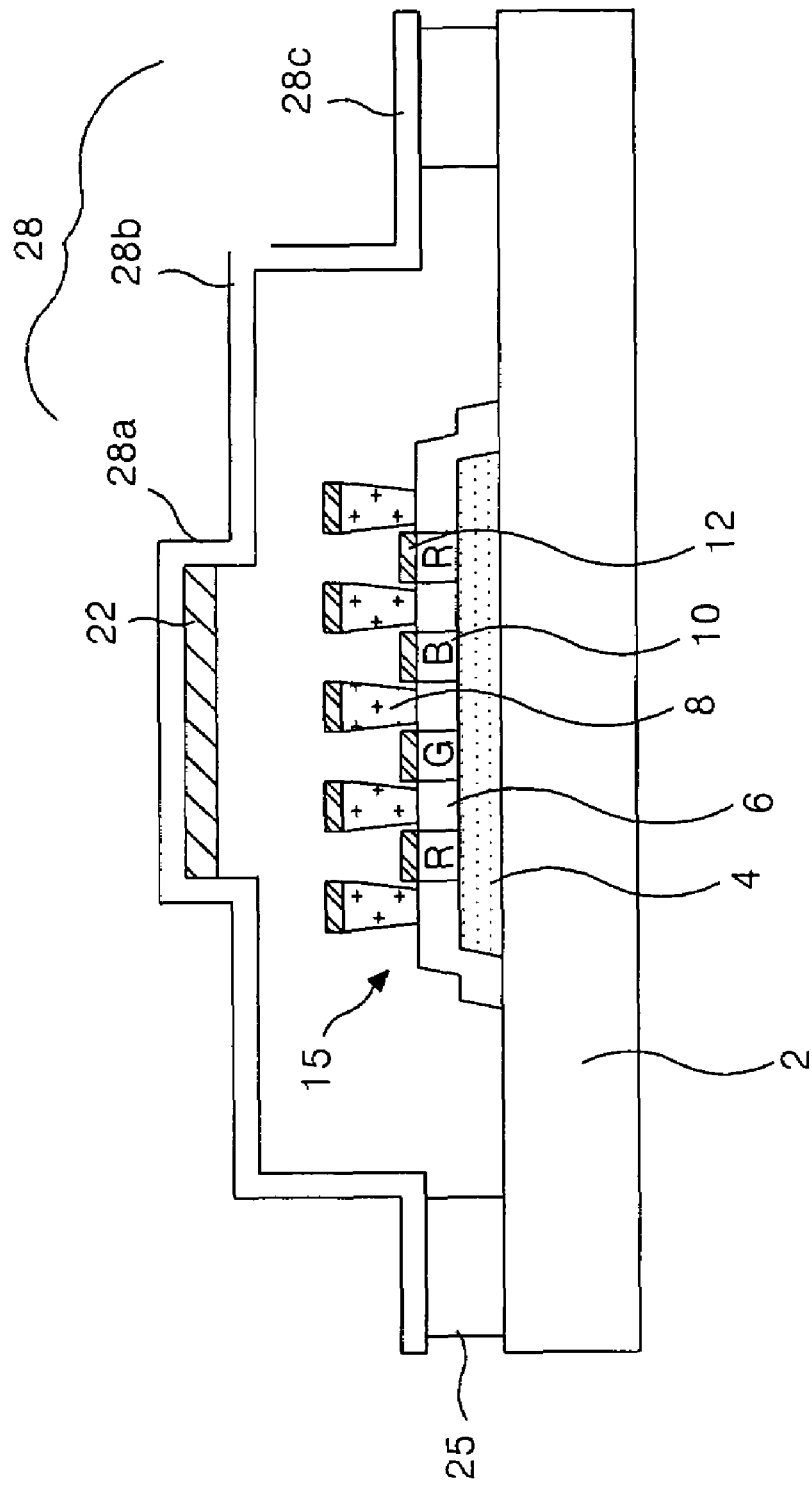
FIG. 1 is a diagram briefly representing a related art organic electro luminescence display device.
Figure 2:
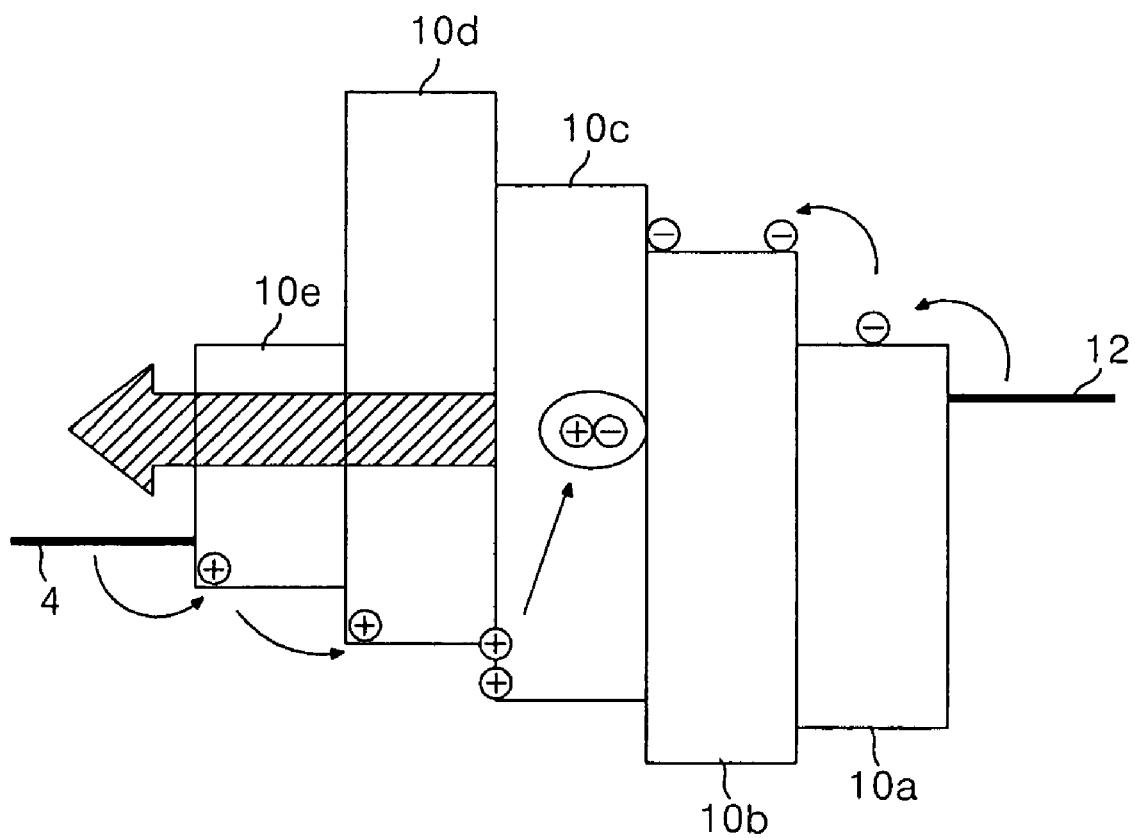
FIG. 2 is a diagram for explaining a light emitting principle of the related art organic electro luminescence display device.
Figure 3:
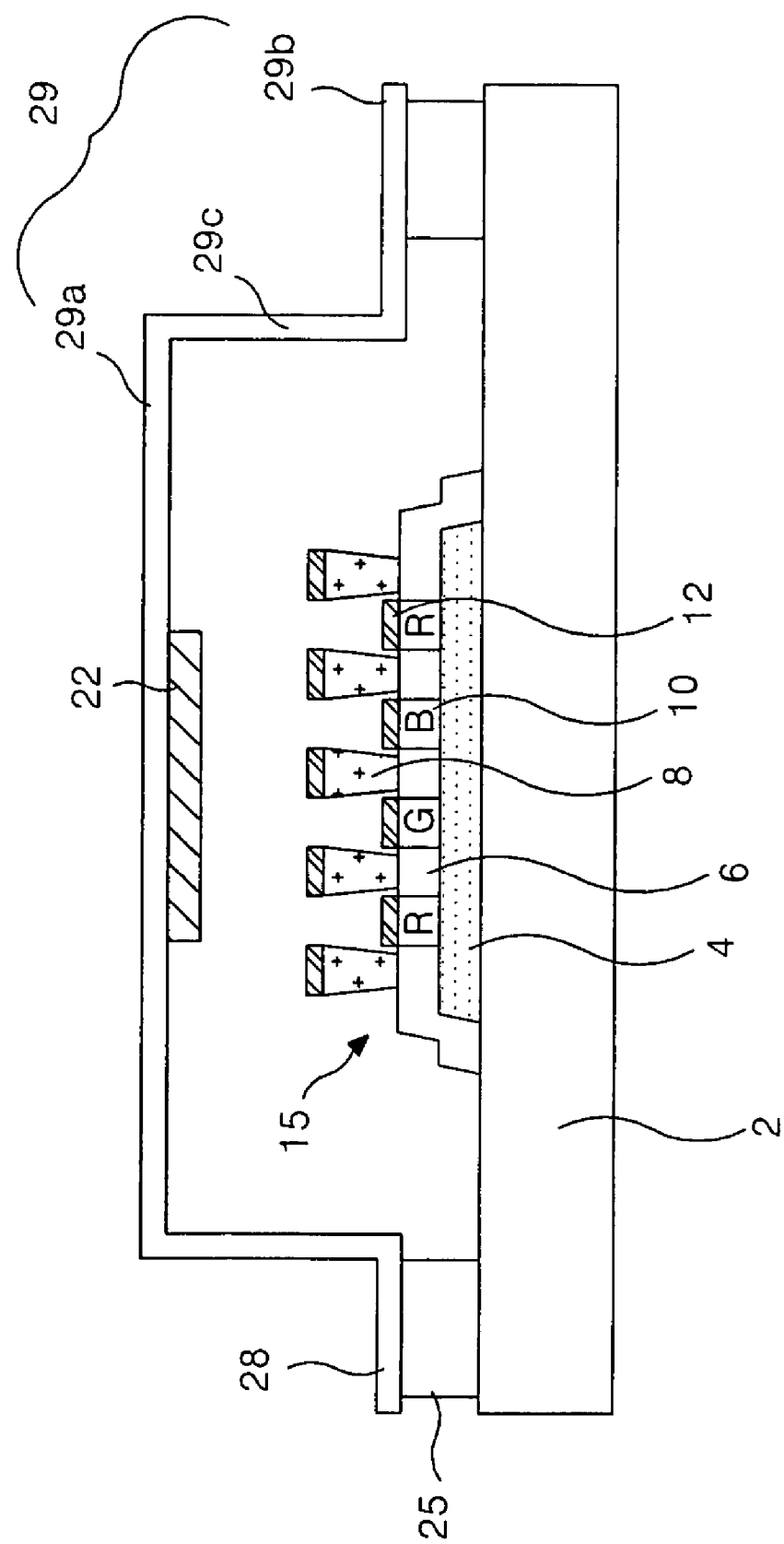
FIG. 3 is a diagram briefly representing an organic electro luminescence display device including a cap of a two step structure.
Figure 4:
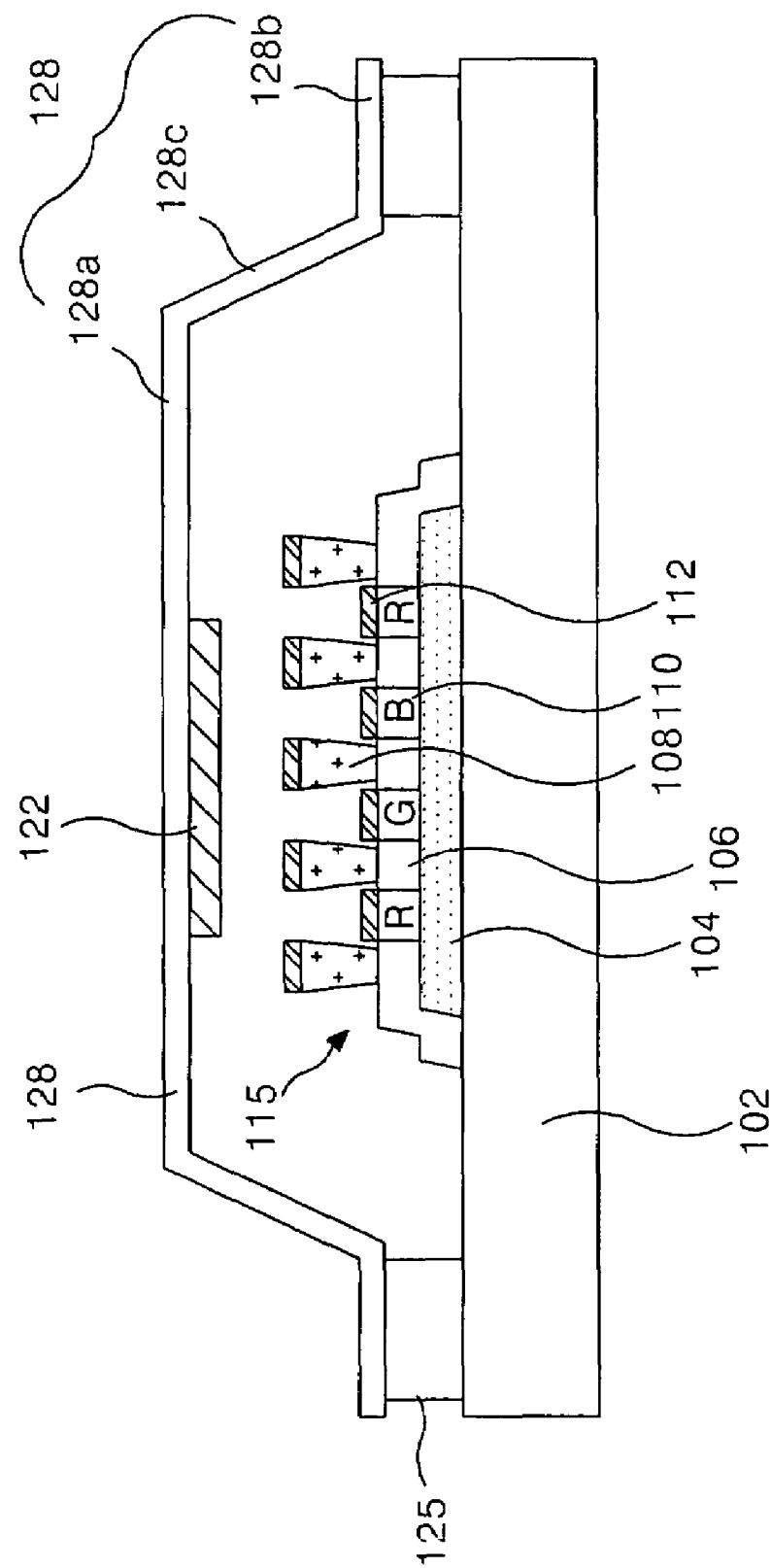
FIG. 4 is a diagram representing an organic electro luminescence display device according to the present invention.

FIG. 4 is a sectional diagram briefly representing an organic electro luminescence display device according to an embodiment of the present invention.

The organic EL display device shown in FIG. 4 includes an organic EL array 115 having a first electrode (or an anode electrode) 104 and a second electrode (or a cathode electrode) 112 formed on a substrate 102 to cross each other with an organic light emitting layer 110 therebetween; and a cap 128 for packaging the organic EL array 115.

A plurality of anode electrodes 104 of the organic EL array 115 is formed on the substrate 102 to be separate from one another with a designated distance therebetween. An insulating film 106 having a hollow part for each EL cell (EL) area is formed on the substrate 102 where the anode electrode 104 is formed. A barrier rib 108 is located on the insulating film 106, wherein the barrier rib 108 separates an organic light emitting layer 110 and the cathode electrode 112 which are to be formed on the insulating film 106. The barrier rib 108 is formed in a direction of traversing the anode electrode 104 and has a reverse taper structure that an upper part has a wider width than a lower part. The organic light emitting layer 110 and the cathode electrode 112 composed of an organic compound are sequentially deposited on the whole surface of the insulating film 106 where the barrier rib 108 is formed. The organic light emitting layer 110 includes an electron injection layer, an electron transport layer, a light emitting layer, a hole transport layer, and a hole injection layer.

The cap 128 includes a first plane 128a having a getter 122 which is located on a surface opposite to the organic EL array 115 and absorbs moisture and oxygen; a second plane 128b over which a sealant 125 is spread and a coupling surface 128c (hereinafter, referred to as "tilt surface") connecting the first plane 128a and the second plane 128b.

The tilt surface 128c of the cap 128 forms an inclination of a designated angle with the second plane 128b differently from the related art, i.e., there is formed an angle of 20°~85° (desirably, about 40°~70°) between the tilt surface 128c and the second plane 128b. In other words, the cap 128 of the organic EL display device according to the present invention, differently from the related art, is formed for the surface, which connects the first plane 128a and the second plane 128b, to have a designated tilt angle, thereby making the device thin and improving rigidity.

With reference to an experimental data shown in FIG. 5 and TABLE 1, this will be explained as follows.

Figure 5:
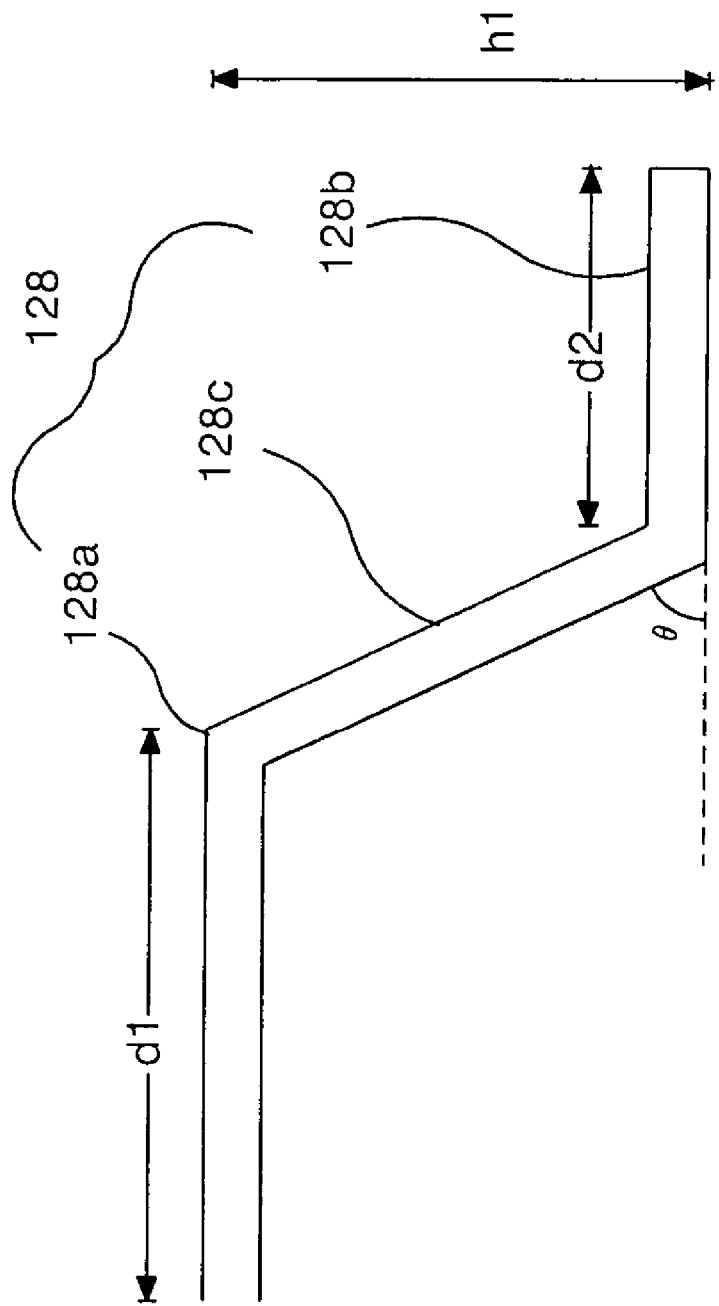
FIG. 5 is a diagram specifically illustrating a cap shown in FIG. 4.

In FIG. 5, d1 represents the length of the first plane 128a of the cap, d2 represents the length of the second plane 128b, θ represents an angle formed by the second plane 128b and the tilt surface 128c, and h1 represents a stepped difference between the first plane 128a and the second plane 128b. In other words, the cap 128 shown in FIG. 5, differently from the related art, is formed for the tilt surface 128c between the first plane 128a and the second plane 128b to have a designated angle.

TABLE 1 represents values of stress concentration, deformation and natural frequency in accordance with the change of the length d1 of the first plane 128a while maintaining the length d2 of the second plane 128b and the stepped difference h1 between the first plane 128a and the second plane 128b of FIG. 5. In other words, if the stepped difference h1 between the first plane 128a and the second plane 128b and the length d2 of the second plane 128b are maintained and the length d1 of the first plane 128a is decreased, then the tilt angle θ is decreased, thus it represents the values of stress concentration, deformation and natural frequency in accordance with the decrease of the tilt angle θ.

TABLE 1

| Changed dimension | Stress concentration (N/mm$^2$) | Deformation (mm) | Natural frequency (Hz) |
|---|---|---|---|
| d1 = 24.80 mm | 158.573 | 0.029 | 177.79 |
| d1 = 22.80 mm | 157.045 | 0.026 | 209.88 |
| d1 = 22.10 mm | 156.545 | 0.025 | 228.08 |
| d1 = 21.40 mm | 154.428 | 0.024 | 235.12 |

Referring to TABLE 1, if the first plane 128a becomes small, the tilt angle θ also becomes small, thus it can be known that the natural frequency is increased and the stress concentration and the deformation are decreased.

Generally, the natural frequency (f) is in proportion to elastic coefficient (E) and the moment of inertia (I), and in inversion proportion to mass (M).

$$f = (E*I)/M \; \{f\text{: natural frequency, } E\text{: elastic coefficient,} \\ I\text{: moment of inertia, } M\text{: mass}\} \quad \text{[FORMULA 1]}$$

In case of changing the structure, the elastic coefficient (E) is fixed and the moment of inertia (I) and the mass (M) are changed. However, the change of the moment of inertia (I) is greater than the mass (M), thus the change amount of natural frequency (f) is most highly affected by the change amount of the moment of inertia (I). Accordingly, if the tilt angle θ is decreased, the value of moment of inertia (I) is changed and the natural frequency (f) is increased.

The increase of the natural frequency (f) increases the rigidity (K) of a structure, and this is explained by the general equation of motion expressed in FORMULA 2.

Equation of motion $[M]\{u''\}+[C]\{u'\}+[K]\{u\}=\{F(t)\}$ [FORMULA 2]

[M]: mass matrix, [C]: attenuation matrix, [K]: rigidity matrix $\{u\}$: mode shape, location, displacement, $\{u\}=\{u0\}\cos wt$. (assuming that it is a harmonic motion)

$\{F(t)\}$: dynamic load, external load according to time

In order to get the natural frequency, assuming that the external dynamic load is $\{F(t)\}=\{0\}$, the attenuation matrix [C] can be ignored. Therefore, the equation of motion is as follows.

$$[M]\{u''\}+[K]\{u\}=\{0\}$$

if mode shape $\{U\}$ is substituted, it becomes $([K]-w^2[M])\{u\}=\{0\}$, and the solution for the equation becomes w2(unique solution), $\{u\}$.

Accordingly, "w", the square root of unique solution, becomes a unique frequency, and the natural frequency (f) can be obtained by $f=w/2\pi$.

Further, it can be like $w^2=[K]/[M]$, $[K]=w^2[M]$, thus the following FORMULA 3 can be derived.

$$[K]=4\pi^2 \times f^2 \times [M] \quad \text{[FORMULA 3]}$$

Therefore, assuming that the change of the mass [M] is not much, it is known that the natural frequency (f) can be increased by changing a sectional shape (I), and the rigidity [K] increases as the natural frequency [f] becomes higher. The conclusion conforms to the experimental result of TABLE 1.

Further, if the tilt angle θ is decreased, the stress concentration on one area for an impact applied to the cap 128 is decreased so that the impact applied thereto is distributed to all over the cap 128, thus the deformation is also decreased.

In this way, the natural frequency of the cap 128 itself is increased as the tilt angle θ is decreased, so that the absorbency for an external impulse is increased and the stress concentration is relaxed to decrease the deformation, thereby improving the rigidity of the cap 128.

On the other hand, in consideration of the securing of the positional space of the organic EL array 115 and the mechanical property of the cap 128 formed of metal, it is desirable that the tilt angle θ is about 20°~85° and the optimal angle is about 40°~70°.

IF the tilt angle θ becomes below 40 degree, it might be possible that the sealant 125 used when bonding the substrate 102 and the cap 128 flows into its inside along an inner wall surface 128c of the cap 128 to contaminate the organic light emitting layer 110. Further, in order to fix the organic EL display device to the circuit substrate of the organic EL display device, a double-sided tape is stuck to the outer surface of the second plane 128b. In this case, in the process of sticking the tape, the part being the standard of the tape adhesion is the tilt surface 128c, and if the angle of the tilt surface 128c is below 40°, the tilt surface 128c does not function as the standard of the tape adhesion.

If the tilt angle θ is above 70°, the mechanical stress is concentrated on a connecting area between the tilt surface 128 and the second plane 128b of the cap 128, and a connecting area between the tilt surface 128c and the first plane 128a, in a cap 128 die design when fabricating the cap 128, thus the cap might be damaged by a small mechanical impact. Accordingly, it is desirable that the tilt angle θ is about 20°~85° and the optimal angle is about 40°~70°.

As described above, the organic electro luminescence display device according to the present invention has the cap of the two step structure having the first and second planes, and the coupling surface connecting the first plane and the second plane is tilted. Accordingly, the device is made thin and the rigidity is improved, thus it can prevent the distortion caused by the mechanical impulse and shock.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro luminescence display device which comprises a cap which houses an organic electro luminescence array, wherein the cap includes:

a first plane part which has a getter located on a surface opposite to the organic electro luminescence array, and extending entirely across the organic electro luminescence display device, and having a length of about 21.40 mm to 21.80 mm;

a second plane part which is bonded with a substrate through a sealant, said substrate directly supporting the organic electro luminescence display device; and a tilt part which connects the first plane part and the second plane part, said tilt part forming a designated angle θ of about 40°~70° between the second plane part and the tilt part, wherein the first plane part, the second plane part and the tilt part substantially surround and house said organic electro luminescence display device, and the organic electro luminescence array includes first and second electrodes formed to cross each other with an organic light emitting layer therebetween and a barrier rib formed in parallel to any one of the first and second electrodes.

* * * * *